US012787883B2

(12) United States Patent
Tsao et al.

(10) Patent No.: US 12,787,883 B2
(45) Date of Patent: Nov. 3, 2026

(54) SEMICONDUCTOR PACKAGE AND FABRICATION METHOD THEREOF

(71) Applicant: MEDIATEK INC., Hsin-Chu (TW)

(72) Inventors: Pei-Haw Tsao, Hsinchu City (TW); Te-Chi Wong, Hsinchu City (TW)

(73) Assignee: MEDIATEK INC., Hsinchu City (TW)

(*) Notice: Subject to any disclaimer, the term of this patent is extended or adjusted under 35 U.S.C. 154(b) by 359 days.

(21) Appl. No.: 18/542,762

(22) Filed: Dec. 17, 2023

(65) Prior Publication Data

US 2024/0243098 A1 Jul. 18, 2024

Related U.S. Application Data

(60) Provisional application No. 63/480,319, filed on Jan. 18, 2023.

(51) Int. Cl.

| | |
|---|---|
| ***H10W 90/00*** | (2026.01) |
| ***H10B 80/00*** | (2026.01) |
| ***H10W 42/00*** | (2026.01) |
| ***H10W 70/60*** | (2026.01) |
| ***H10W 74/10*** | (2026.01) |
| ***H10W 74/15*** | (2026.01) |

(52) U.S. Cl.

CPC ............ *H10W 90/00* (2026.01); *H10B 80/00* (2023.02); *H10W 42/121* (2026.01); *H10W 70/611* (2026.01); *H10W 74/141* (2026.01); *H10W 90/401* (2026.01); *H10W 90/701* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 2003/0122241 A1* | 7/2003 | Wang | .................... | H10W 74/47 257/E21.503 |
| 2005/0212149 A1 | 9/2005 | Cowens | | |
| 2008/0169555 A1 | 7/2008 | Topacio | | |
| 2010/0301460 A1 | 12/2010 | Zhang | | |
| 2016/0358865 A1* | 12/2016 | Shih | .................... | H10W 42/121 |
| 2018/0138151 A1 | 5/2018 | Shih | | |

(Continued)

FOREIGN PATENT DOCUMENTS

TW 202044432 A 12/2020

OTHER PUBLICATIONS

P. K. Huang et al., Wafer Level System Integration of the Fifth Generation CoWoS-S with High Performance Si Interposer at 2500 mm2, 2021 IEEE 71st Electronic Components and Technology Conference (ECTC), pp. 101-104, XP033956991 ,2021.

*Primary Examiner* — Jay C Chang

(74) *Attorney, Agent, or Firm* — Winston Hsu

(57) ABSTRACT

A semiconductor package includes a package substrate, an interposer on and electrically connected to the package substrate, a central logic die disposed on and electrically connected to the interposer, peripheral function dies disposed on and electrically connected to the interposer and located in proximity to the central logic die, and at least one dummy die disposed between the central logic die and the peripheral function dies so as to form a rectangular shaped die arrangement. The at least one dummy die is disposed at a corner position of the rectangular shaped die arrangement.

17 Claims, 10 Drawing Sheets

(56) References Cited

U.S. PATENT DOCUMENTS

| | | | | |
|---|---|---|---|---|
| 2021/0151388 | A1* | 5/2021 | Choi | H10W 42/121 |
| 2022/0230969 | A1 | 7/2022 | Yeh | |
| 2022/0302081 | A1 | 9/2022 | Hsu | |
| 2023/0197657 | A1* | 6/2023 | Sakuma | H10W 72/20<br>257/737 |

* cited by examiner

SEMICONDUCTOR PACKAGE AND FABRICATION METHOD THEREOF

CROSS REFERENCE TO RELATED APPLICATIONS

This application claims the benefit of U.S. Provisional Application No. 63/480,319, filed on Jan. 18, 2023. The content of the application is incorporated herein by reference.

BACKGROUND

The present disclosure relates generally to the field of semiconductor packaging. More particularly, the present disclosure relates to a package and a method for making the same.

As known in the art, Chip-on-Wafer-on-Substrate (CoWoS) is a 2.5D wafer-level multi-chip packaging technology that incorporates multiple dies side-by-side on a silicon interposer substrate in order to achieve better interconnect density and performance. Individual chips are bonded through micro-bumps on the silicon interposer substrate forming a chip-on-wafer (CoW). The CoW is then subsequently thinned such that the through substrate via (TSV) perforations are exposed. C4 bumps formation and singulation are then carried out. A CoWoS package is completed through bonding to a package substrate.

The prior art CoWoS packages have a drawback in that the fatigue failure such as underfill delamination may be observed at the package corners during or after the temperature cycle testing (TCT). The underfill delamination may cause reliability issues. Therefore, there is a need in this technical field to provide an improved CoWoS package with increased reliability pass rate.

SUMMARY

It is one object of the present disclosure to provide an improved semiconductor package in order to solve the prior art deficiencies or shortcomings.

One aspect of the invention provides a semiconductor package including a package substrate; an interposer disposed on and electrically connected to the package substrate; at least one central logic die disposed on and electrically connected to the interposer; a plurality of peripheral function dies disposed on and electrically connected to the interposer and located in proximity to the at least one central logic die; and at least one dummy die disposed between the at least one central logic die and the plurality of peripheral function dies so as to form a rectangular shaped die arrangement. The at least one dummy die is disposed at a corner position of the rectangular shaped die arrangement. A first underfill is filled into a gap between the at least one central logic die and the interposer, a gap between the plurality of peripheral function dies and the interposer, a gap between the at least one dummy die and the interposer, a gap between the at least one central logic die and the plurality of peripheral function dies, and a gap between the at least one central logic die and the at least one dummy die. An epoxy molding compound encapsulates the at least one central logic die, the plurality of peripheral function die, and the at least one dummy die. A second underfill is filled into a gap between the interposer and the package substrate.

According to some embodiments, the at least one dummy die comprises an adhesion polymer layer disposed on its bonding surface.

According to some embodiments, the adhesion polymer layer comprises polyimide (PI) or polybenzoxazole (PBO).

According to some embodiments, the adhesion polymer layer is disposed on a passivation layer, wherein the adhesion polymer layer covers a perimeter of an under-bump metal metallurgy (UBM) of a pad of the at least one dummy die.

According to some embodiments, the at least one central logic die comprises a system-on-chip (SoC), a central processing unit (CPU) die, a graphic processing unit (GPU) die, an RF die, or an application processor (AP) die.

According to some embodiments, the plurality of peripheral function dies comprises memory dies.

According to some embodiments, the at least one dummy die comprises a silicon die.

According to some embodiments, the at least one dummy die comprises ceramic, metal, polymer, or thermal conductive materials.

According to some embodiments, a size of the interposer is greater than 1.5 reticle size, wherein 1 reticle size is 26 mm×34 mm.

According to some embodiments, the interposer comprises a silicon interposer and comprises a plurality of through silicon vias.

According to some embodiments, the interposer comprises organic material.

According to some embodiments, the at least one central logic die, the plurality of peripheral function dies, and the at least one dummy die have substantially the same die thickness.

According to some embodiments, the at least one central logic die is mounted on the interposer through first micro-bumps, the plurality of peripheral function dies is mounted on the interposer through second micro-bumps, and the at least one dummy die is mounted on the interposer through third micro-bumps.

According to some embodiments, the first, second, and third micro-bumps are surrounded by the first underfill.

According to some embodiments, the interposer is connected to the package substrate through flip chip bumps or C4 bumps.

According to some embodiments, the flip chip bumps or C4 bumps are surrounded by the second underfill.

According to some embodiments, the semiconductor package further comprises a stiffener ring mounted on a top surface of the package substrate.

According to some embodiments, the stiffener ring comprises metal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. The term "dummy die", which is a non-function die, is referred to as a semiconductor die or chip that does not have any electrical function.

Figure 1:
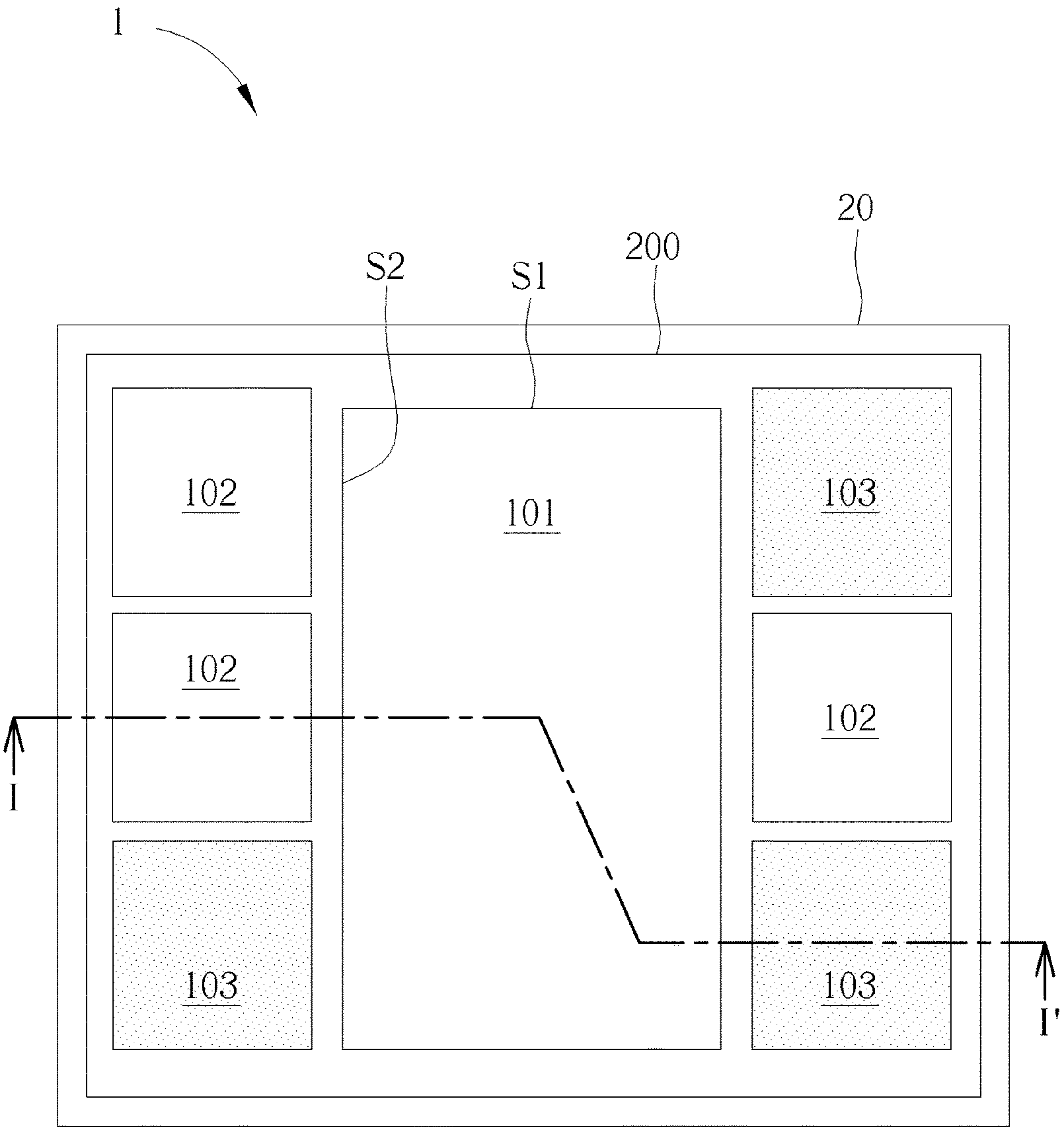
FIG. 1 is a schematic chip placement diagram of an exemplary CoWoS package in accordance with one embodiment of the invention.
Figure 2:
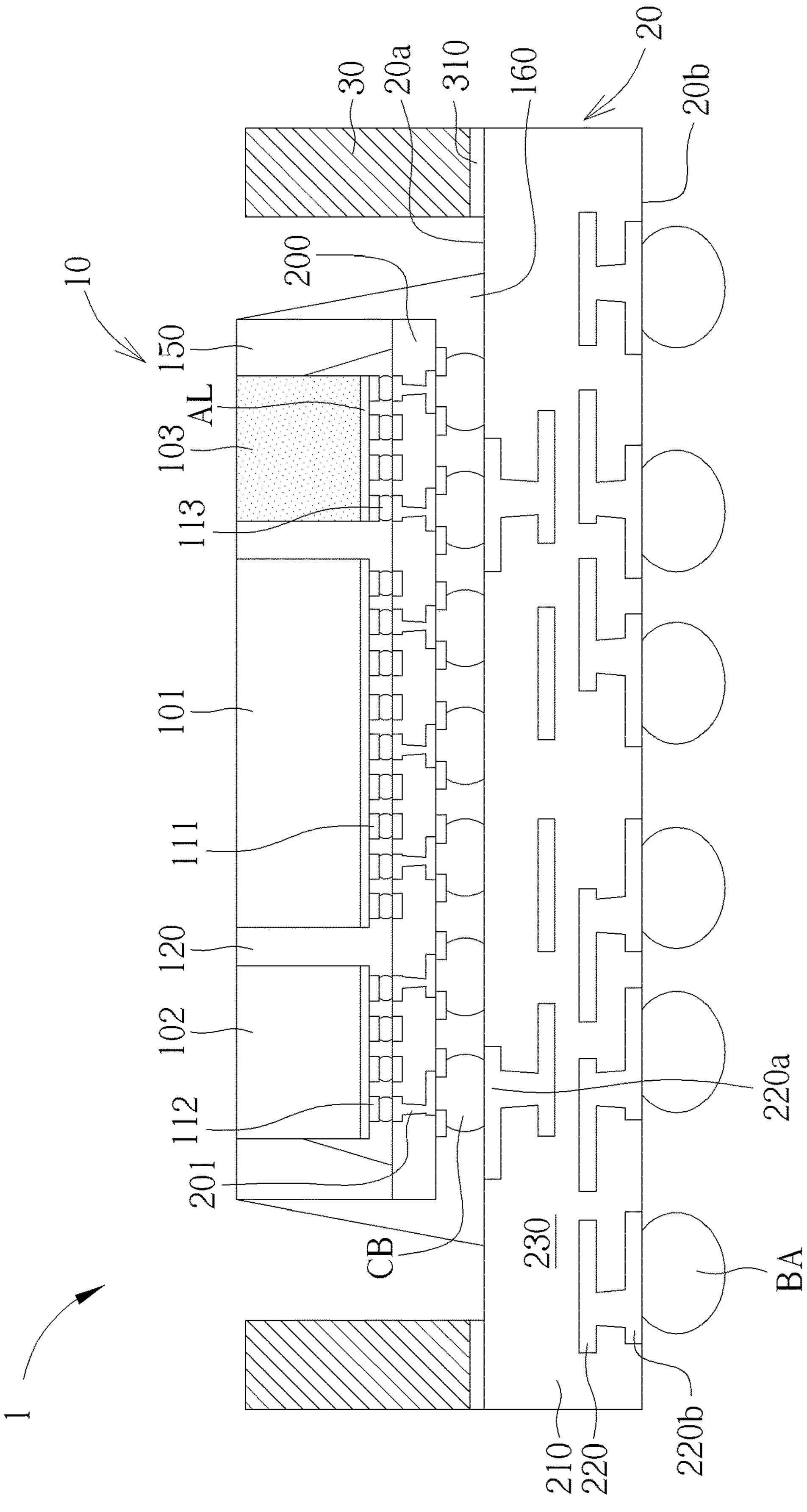
FIG. 2 is a cross-sectional view taken along line I-I' of FIG. 1.

Please refer to FIG. 1 and FIG. 2. FIG. 1 is a schematic chip placement diagram of an exemplary CoWoS package in accordance with one embodiment of the invention. FIG. 2 is a cross-sectional view taken along line I-I' of FIG. 1. As shown in FIG. 1 and FIG. 2, the semiconductor package 1 such as a Chip-on-Wafer-on-Substrate (CoWoS) package may comprise at least one central logic die 101 and multiple peripheral function dies 102 disposed in proximity to the central logic die 101. At least one dummy die 103 is disposed between the central logic die 101 and the multiple peripheral function dies 102 to form a rectangular shaped die arrangement. According to an embodiment, for example, the dummy die 103 may include, but is not limited to, a silicon die with a similar structure to the central logic die 10 or the peripheral function die 102, but does not have any electrical function. According to an embodiment, preferably, the at least one dummy die 103 is disposed at a corner position of the rectangular shaped die arrangement.

As can be seen in FIG. 1, for example, the rectangular shaped die arrangement may be comprised of seven dies including, but not limited to, one larger central logic die 101 having a shorter side S1 and a longer side S2, three smaller, peripheral function dies 102 disposed along the longer side S2 of the central logic die 101, and three dummy dies 103 disposed at the respective three corners. According to an embodiment, for example, the central logic die 101 may be a system-on-chip (SoC), a central processing unit (CPU) die, a graphic processing unit (GPU) die, an RF die, or an application processor (AP) die, but it not limited thereto.

According to an embodiment, for example, the peripheral function dies 102 may comprise memory dies such as high-bandwidth memory (HBM) dies comprise of a stack of DRAM dies, but not limited thereto. According to an embodiment, for example, the peripheral function dies 102 may be HBM2 or HBM3, but not limited thereto. HBM is a memory chip with low power consumption and ultra-wide communication lanes.

According to an embodiment, for example, the dummy dies 103 may be passive silicon dies. According to an embodiment, for example, the dummy dies 103 may comprise any suitable materials, for example, ceramic, metal, polymer, or thermal conductive materials.

As shown in FIG. 1 and FIG. 2, the central logic die 101, the peripheral function die 102, and the dummy die 103 are mounted on an interposer 200. According to an embodiment, for example, the size of the interposer 200 may be greater than 1.5 reticle size, wherein 1 reticle size is 26 mm×34 mm. According to an embodiment, for example, the interposer 200 may be a silicon interposer and may comprise a plurality of through silicon vias (TSVs) 201. In some embodiments, the interposer 200 may comprise an organic material.

According to an embodiment, for example, the central logic die 101 may be mounted on the interposer 200 through micro-bumps 111, the peripheral function die 102 may be mounted on the interposer 200 through micro-bumps 112, and the dummy die 103 may be mounted on the interposer 200 through micro-bumps 113. According to an embodiment, for example, the micro-bumps 111, 112, 113 may comprise nickel, copper, gold, palladium, and/or SnAg solder. According to an embodiment, for example, the central logic die 101, the peripheral function die 102, and the dummy die 103 may have substantially the same die thickness.

According to an embodiment, for example, the gap between the central logic die 101 and the interposer 200, the gap between the peripheral function die 102 and the interposer 200, the gap between the dummy die 103 and the interposer 200, the gap between the central logic die 101 and the peripheral function die 102, and the gap between the central logic die 101 and the dummy die 103 are filled with an underfill 120. According to an embodiment, for example, the micro-bumps 111, 112, 113 are surrounded by the underfill 120. In some embodiments, for example, the underfill 120 may be placed using a capillary flow process after the dies are attached to the interposer 200.

According to an embodiment, for example, the dummy die 103 comprises adhesion polymer layer AL on its bonding surface to increase the adhesion ability between the dummy die and the underfill. The adhesion polymer layer AL can alleviate or avoid fatigue failure such as underfill delamination at the package corners during temperature cycle testing (TCT) of the semiconductor package 1.

Figure 3:
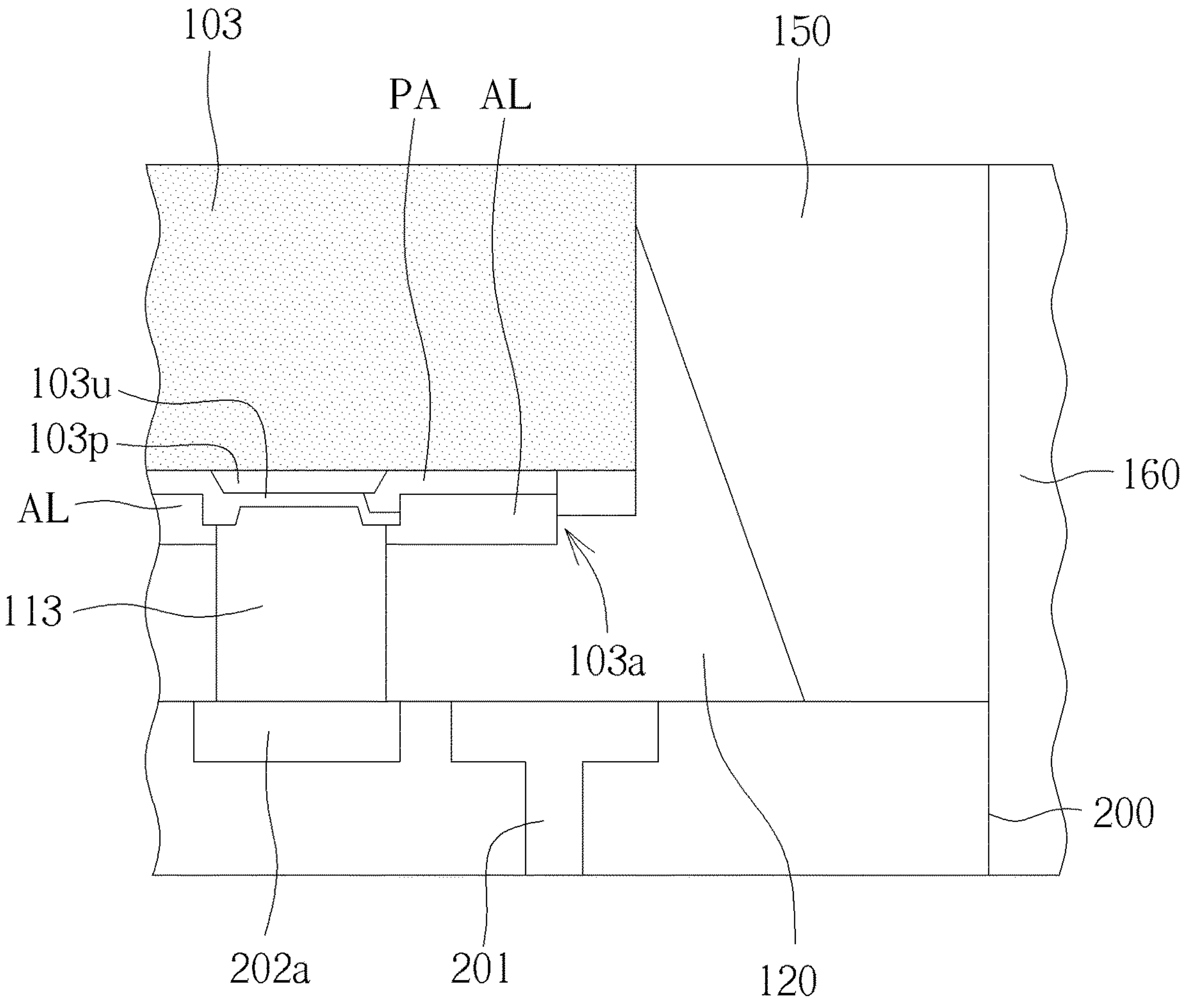
FIG. 3 is an enlarged view of FIG. 2 showing the interface between the underfill and the dummy die.

Please also refer to FIG. 3. FIG. 3 is an enlarged view showing the interface between the underfill 120 and the dummy die 103 within the dotted line area of FIG. 2, wherein like regions, layers or elements are designated by like numeral numbers or labels. According to an embodiment, the adhesion polymer layer AL is the topmost layer on the bonding surface 103*a* of the dummy die 103 and the adhesion polymer layer AL is in direct contact with the underfill 120. According to an embodiment, for example, the adhesion polymer layer AL may comprise polyimide (PI) or polybenzoxazole (PBO), but is not limited thereto. According to an embodiment, the adhesion polymer layer AL may be formed on a passivation layer PA. According to an embodiment, the adhesion polymer layer AL covers a perimeter of an under-bump metal metallurgy (UBM) 103*u* of a pad 103*p* of the dummy die 103. The micro-bump 113 is formed on the UBM 103*u* and is electrically connected to a connection pad 202*a* of the interposer 200.

According to an embodiment, the central logic die 101, the peripheral function die 102, and the dummy die 103 may be encapsulated by an epoxy molding compound 150 on the interposer 200, thereby forming a Chip-on-Wafer (CoW) package 10. According to an embodiment, the CoW package 10 may be mounted onto a top surface 20*a* of a package substrate 20. According to an embodiment, for example, the CoW package 10 may be connected to the package substrate 20 through a plurality of flip chip bumps or C4 bumps CB.

According to an embodiment, for example, the gap between the interposer 200 of the CoW package 10 and the package substrate 20 is filled with an underfill 160. In some embodiments, for example, the underfill 160 may be placed using a capillary flow process after the CoW package 10 is attached to the package substrate 20 having a dimension of, for example, greater than 60 mm×60 mm.

According to an embodiment, to cope with the warpage problem, a stiffener ring 30 such as a metal ring may be mounted on the top surface 20*a* of the package substrate 20 with an adhesive layer 310. According to an embodiment, the package substrate 20 may comprise a core 210 that may be made of woven glass layers pre-impregnated with an epoxy resin material, such as the prepreg laminate FR-4 commonly used for printed circuit boards. Dielectric build-up layers 230 may be formed on two opposite sides of the core 210. Connection pads 220*a*, 220*b* and conductive copper traces 220 may be formed on the core 210 to provide the interconnection between the CoW package 10 and the system to which it is mounted. On the bottom surface 20*b* of the package substrate 20, a plurality of solder balls BA may be provided on the respective connection pads 220*b*.

Figure 4:
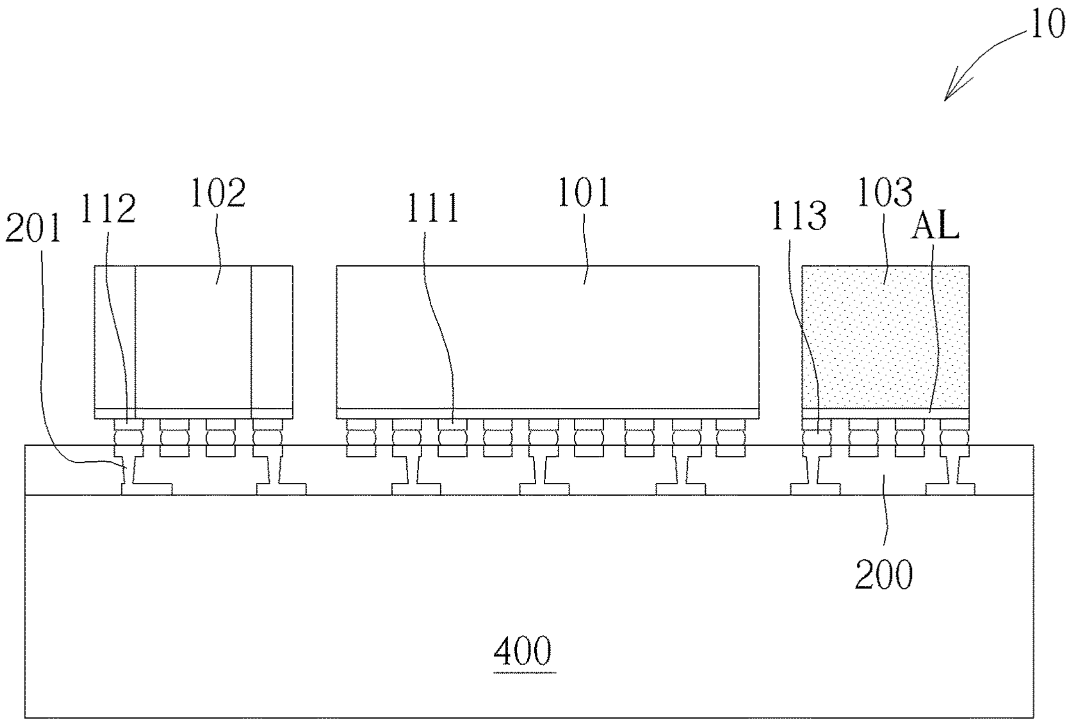
FIG. 4 to FIG. 12 are schematic diagrams showing an exemplary method for fabricating a semiconductor package according to an embodiment of the invention.

FIG. 4 to FIG. 12 are schematic diagrams showing an exemplary method for fabricating a semiconductor package according to an embodiment of the invention. As shown in FIG. 4, a carrier substrate 400 is provided. For example, the carrier substrate 400 may be a glass substrate, but is not limited thereto. An interposer 200 is formed on the carrier substrate 400. According to an embodiment, for example, the interposer 200 may be a silicon interposer and may comprise a plurality of through silicon vias 201. In some embodiments, the interposer 200 may comprise an organic material. A central logic die 101, at least one peripheral function die 102, and at least one dummy die 103 are mounted on an interposer 200 in a flip-chip manner. According to an embodiment, for example, the dummy die 103 comprises an adhesion polymer layer AL disposed on its bonding surface.

According to an embodiment, for example, the central logic die 101 may be mounted on the interposer 200 through micro-bumps 111, the peripheral function die 102 may be mounted on the interposer 200 through micro-bumps 112, and the dummy die 103 may be mounted on the interposer 200 through micro-bumps 113. According to an embodiment, for example, the micro-bumps 111, 112, 113 may comprise nickel, copper, gold, palladium, and/or SnAg solder.

According to an embodiment, for example, the central logic die 101, the peripheral function die 102, and the dummy die 103 may have substantially the same die thickness.

Figure 5:
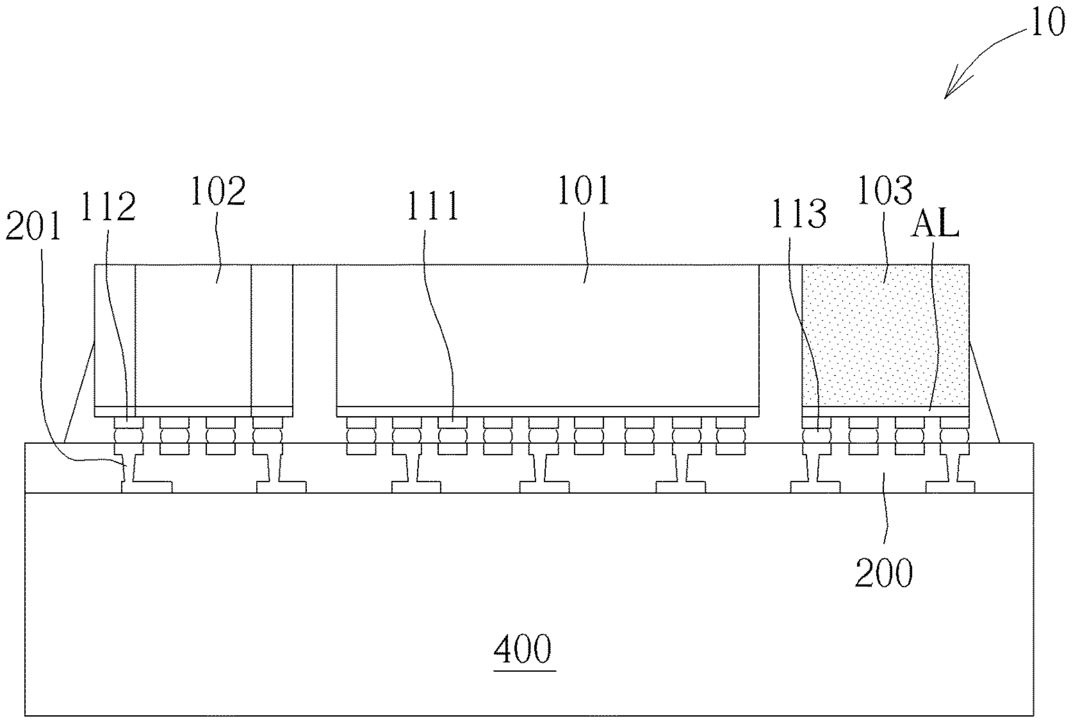

As shown in FIG. 5, the gap between the central logic die 101 and the interposer 200, the gap between the peripheral function die 102 and the interposer 200, the gap between the dummy die 103 and the interposer 200, the gap between the central logic die 101 and the peripheral function die 102, and the gap between the central logic die 101 and the dummy die 103 are filled with an underfill 120. According to an embodiment, for example, the micro-bumps 111, 112, 113 are surrounded by the underfill 120. In some embodiments, for example, the underfill 120 may be placed using a capillary flow process after the dies are attached to the interposer 200.

Figure 6:
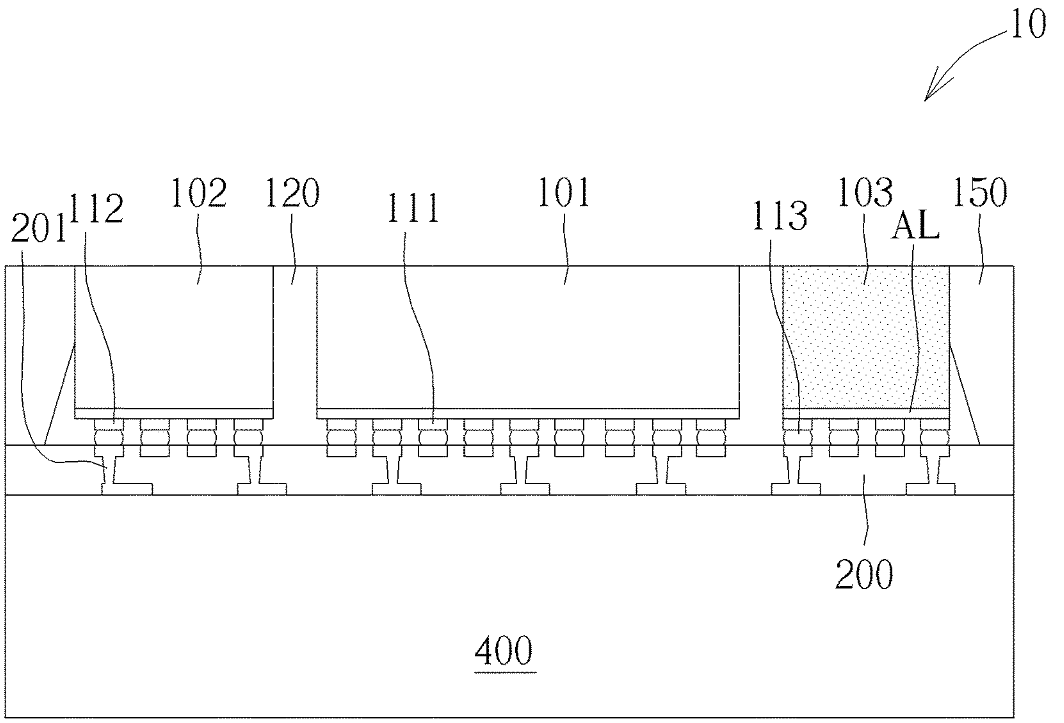

As shown in FIG. 6, the central logic die 101, the peripheral function die 102, and the dummy die 103 may be encapsulated by an epoxy molding compound 150 on the interposer 200.

Figure 7:
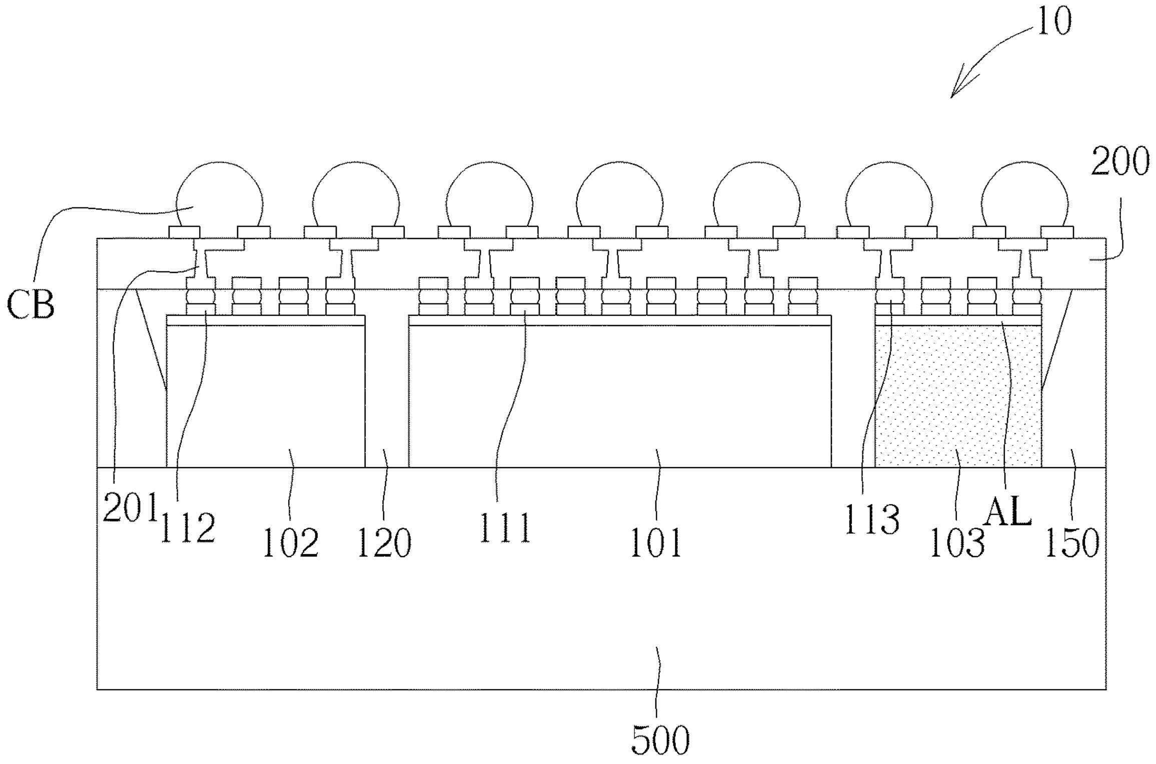

As shown in FIG. 7, another carrier substrate 500 is attached to the exposed passive surfaces of the central logic die 101, the peripheral function die 102, and the dummy die 103. For example, the carrier substrate 500 may be a glass substrate, but is not limited thereto. Subsequently, the carrier substrate 400 is removed to expose a surface of the interposer 200. C4 bumps CB are then formed on the exposed surface of the interposer 200.

Figure 8:
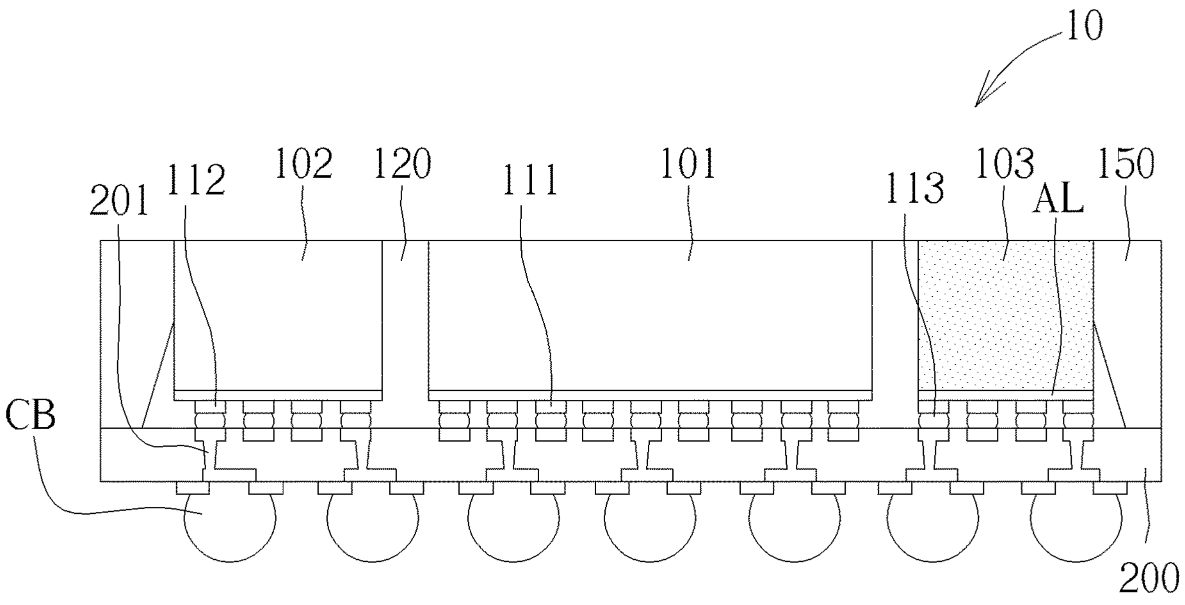

As shown in FIG. 8, after forming the C4 bumps CB, the carrier substrate 500 is removed, thereby forming a Chip-on-Wafer (CoW) package 10.

Figure 9:
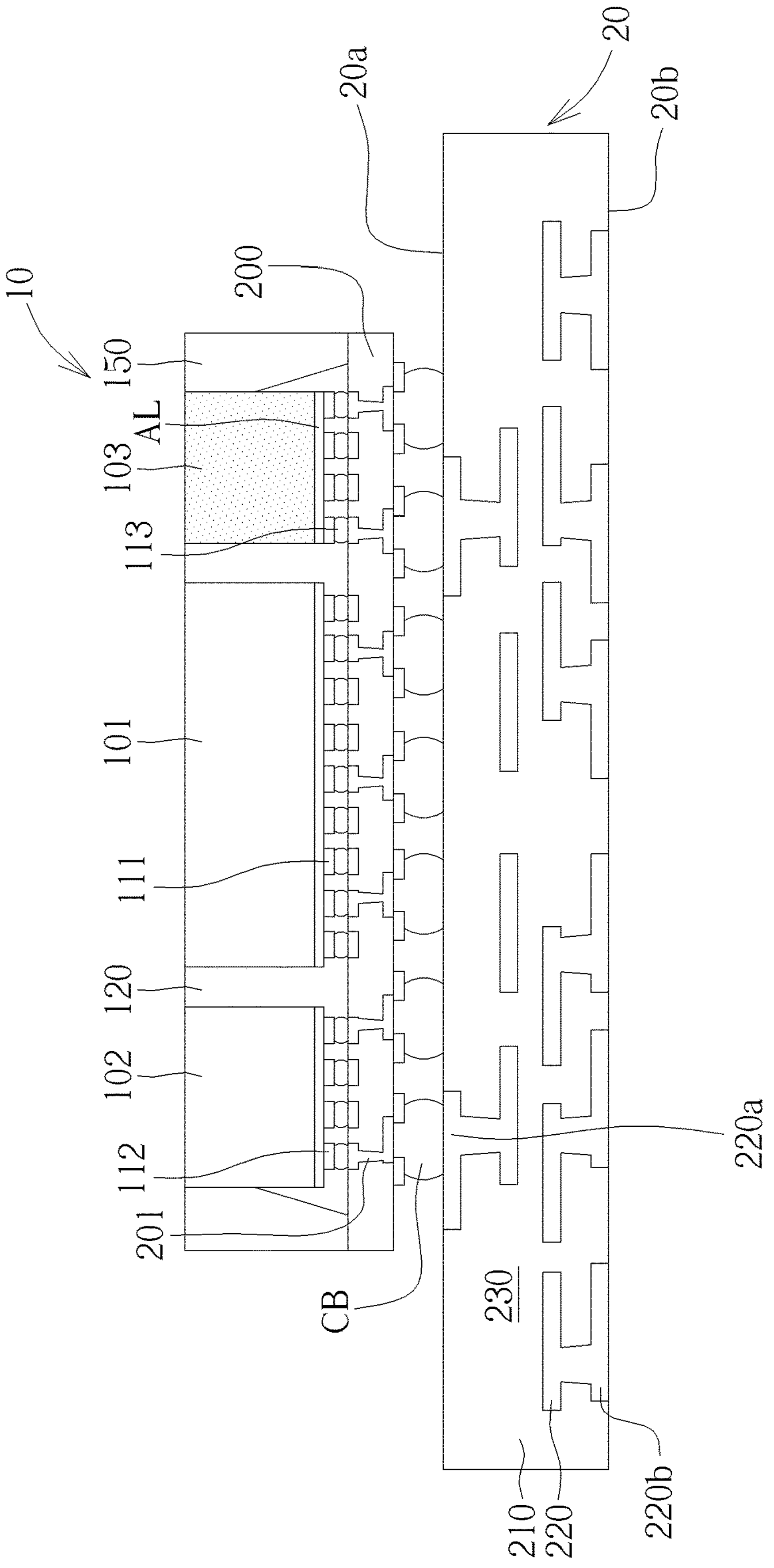

As shown in FIG. 9, the CoW package 10 is mounted onto a top surface 20*a* of a package substrate 20. According to an embodiment, for example, the CoW package 10 may be connected to the package substrate 20 through the C4 bumps CB. The package substrate 20 has a dimension of, for example, greater than 60 mm×60 mm.

Figure 10:
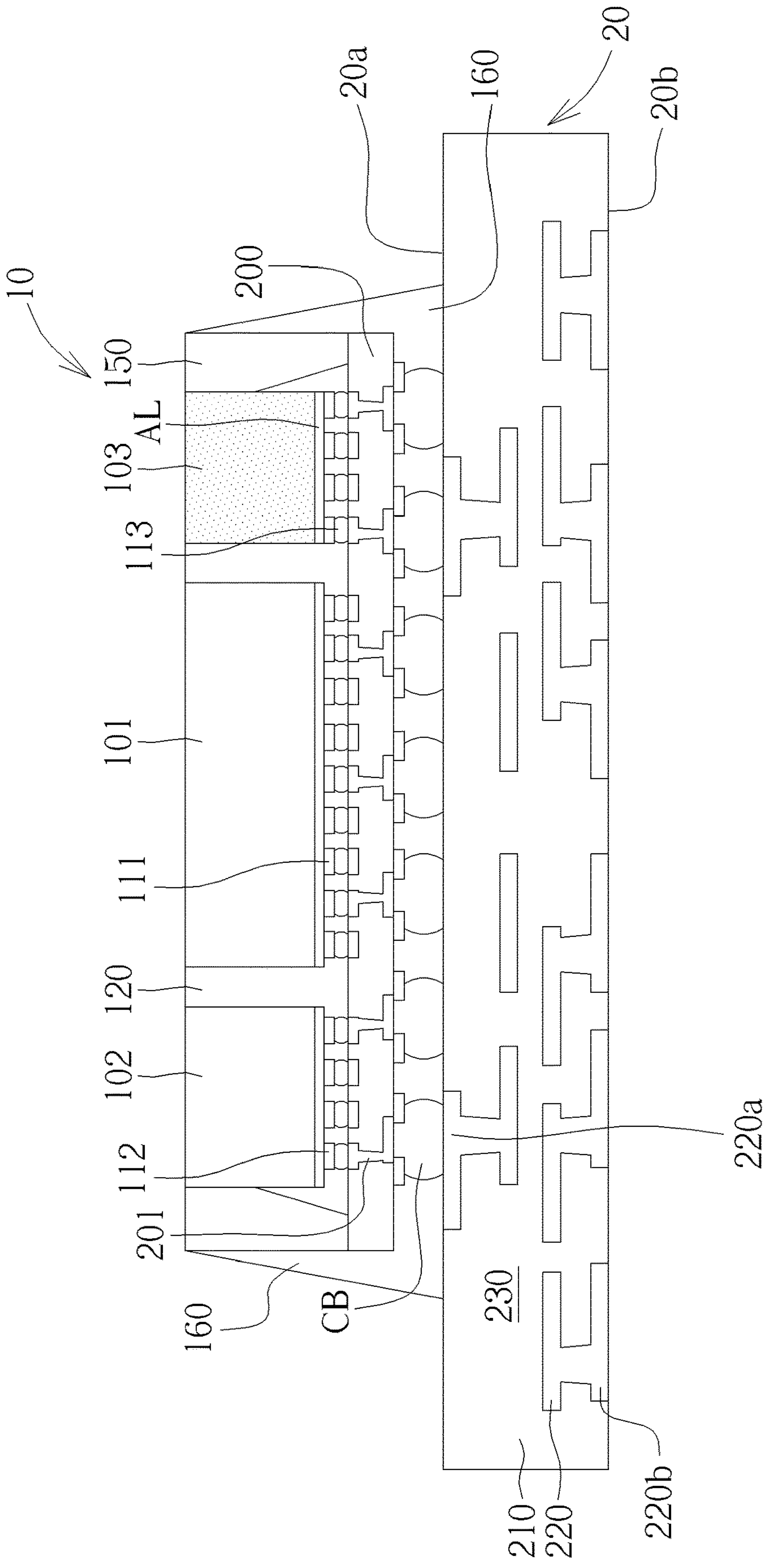

As shown in FIG. 10, the gap between the CoW package 10 and the package substrate 20 is filled with an underfill 160. In some embodiments, for example, the underfill 160 may be placed using a capillary flow process after the CoW package 10 is attached to the package substrate 20.

Figure 11:
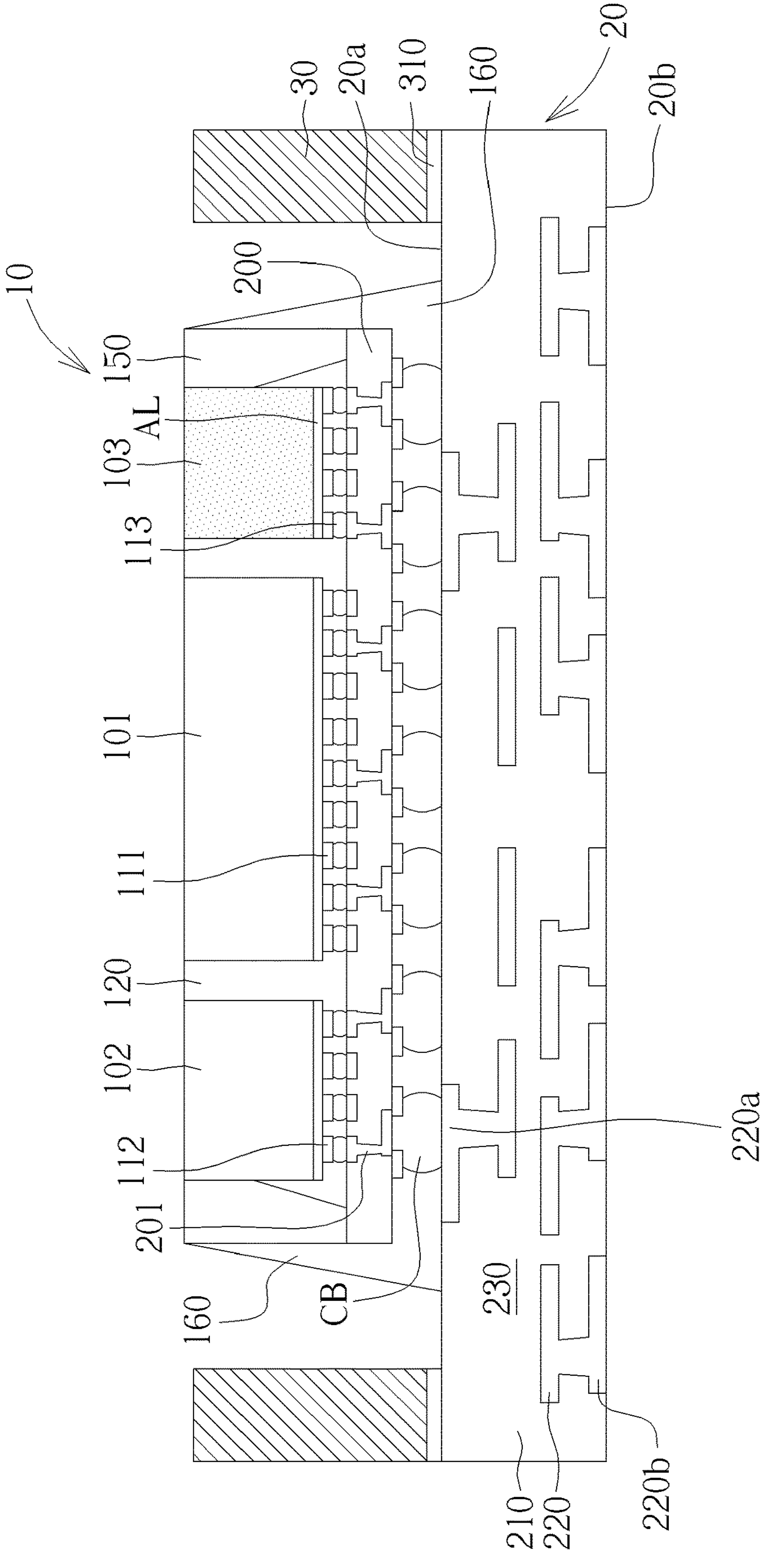

Subsequently, as shown in FIG. 11, a stiffener ring 30 such as a metal ring may be mounted on the top surface 20*a* of the package substrate 20 with an adhesive layer 310. According to an embodiment, for example, the stiffener ring 30 may comprise copper, stainless steel, or aluminum, but is not limited thereto.

Figure 12:
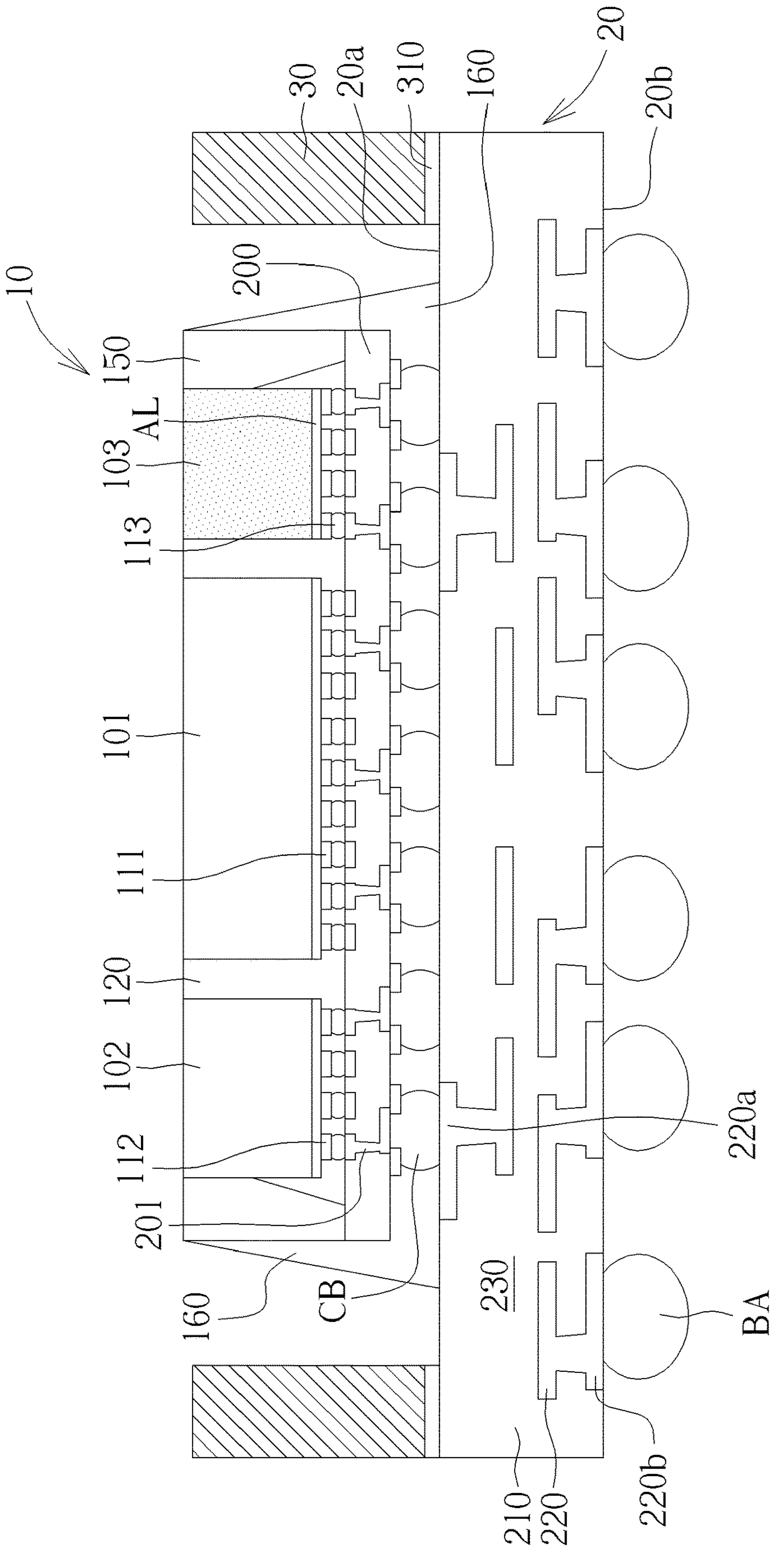

Subsequently, as shown in FIG. 12, a plurality of solder balls BA may be mounted on a bottom surface of the package substrate 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
- a package substrate;
- an interposer disposed on and electrically connected to the package substrate;
- at least one central logic die disposed on and electrically connected to the interposer;
- a plurality of peripheral function dies disposed on and electrically connected to the interposer and located in proximity to the at least one central logic die;
- at least one dummy die disposed between the at least one central logic die and the plurality of peripheral function dies so as to form a rectangular shaped die arrangement, wherein the at least one dummy die is disposed at a corner position of the rectangular shaped die arrangement, wherein the at least one dummy die comprises an adhesion polymer layer disposed on a bonding surface of the at least one dummy die;
- a first underfill filling a gap between the at least one central logic die and the interposer, a gap between the plurality of peripheral function dies and the interposer, a gap between the at least one dummy die and the interposer, a gap between the at least one central logic die and the plurality of peripheral function dies, and a gap between the at least one central logic die and the at least one dummy die;

an epoxy molding compound encapsulating the at least one central logic die, the plurality of peripheral function die, and the at least one dummy die; and a second underfill filling a gap between the interposer and the package substrate.

2. The semiconductor package according to claim 1, wherein the adhesion polymer layer comprises polyimide (PI) or polybenzoxazole (PBO).

3. The semiconductor package according to claim 1, wherein the adhesion polymer layer is disposed on a passivation layer, wherein the adhesion polymer layer covers a perimeter of an under-bump metal metallurgy (UBM) of a pad of the at least one dummy die.

4. The semiconductor package according to claim 1, wherein the at least one central logic die comprises a system-on-chip (SoC), a central processing unit (CPU) die, a graphic processing unit (GPU) die, a radio-frequency (RF die, or an application processor (AP) die.

5. The semiconductor package according to claim 1, wherein the plurality of peripheral function dies comprises memory dies.

6. The semiconductor package according to claim 1, wherein the at least one dummy die comprises a silicon die.

7. The semiconductor package according to claim 1, wherein the at least one dummy die comprises ceramic, metal, polymer, or thermal conductive materials.

8. The semiconductor package according to claim 1, wherein a size of the interposer is greater than 1.5 reticle size, wherein 1 reticle size is 26 mm×34 mm.

9. The semiconductor package according to claim 1, wherein the interposer comprises a silicon interposer and comprises a plurality of through silicon vias.

10. The semiconductor package according to claim 1, wherein the interposer comprises organic material.

11. The semiconductor package according to claim 1, wherein the at least one central logic die, the plurality of peripheral function dies, and the at least one dummy die have substantially the same die thickness.

12. The semiconductor package according to claim 1, wherein the at least one central logic die is mounted on the interposer through first micro-bumps, the plurality of peripheral function dies is mounted on the interposer through second micro-bumps, and the at least one dummy die is mounted on the interposer through third micro-bumps.

13. The semiconductor package according to claim 12, wherein the first, second, and third micro-bumps are surrounded by the first underfill.

14. The semiconductor package according to claim 1, wherein the interposer is connected to the package substrate through flip chip bumps or C4 bumps.

15. The semiconductor package according to claim 14, wherein the flip chip bumps or C4 bumps are surrounded by the second underfill.

16. The semiconductor package according to claim 1 further comprising:

a stiffener ring mounted on a top surface of the package substrate.

17. The semiconductor package according to claim 16, wherein the stiffener ring comprises metal.

* * * * *